United States Patent
Mattero et al.

(10) Patent No.: US 7,827,909 B2
(45) Date of Patent: Nov. 9, 2010

(54) STENCIL PRINTER WITH MULTIPLEXED CONTROL OF MULTI-AXIS MACHINE HAVING DISTRIBUTED CONTROL MOTOR AMPLIFIER

(75) Inventors: Patsy Anthony Mattero, Smithfield, RI (US); John G. Klauser, Holliston, MA (US)

(73) Assignee: Illinois Tool Works Inc., Glenview, IL (US)

( * ) Notice: Subject to any disclaimer, the term of this patent is extended or adjusted under 35 U.S.C. 154(b) by 852 days.

(21) Appl. No.: 11/787,755

(22) Filed: Apr. 17, 2007

(65) Prior Publication Data

US 2008/0257179 A1  Oct. 23, 2008

(51) Int. Cl.
*B41F 15/08* (2006.01)

(52) U.S. Cl. .................. 101/114; 101/123; 101/124; 101/126

(58) Field of Classification Search ............... 101/114, 101/123, 124, 126
See application file for complete search history.

(56) References Cited

U.S. PATENT DOCUMENTS

| | | | |
|---|---|---|---|
| 5,060,063 | A | 10/1991 | Freeman |
| 5,092,510 | A | 3/1992 | Anstrom et al. |
| 5,157,438 | A | 10/1992 | Beale |
| 5,237,250 | A | 8/1993 | Zeile et al. |
| RE34,615 | E | 5/1994 | Freeman |
| 5,707,052 | A | 1/1998 | Adams et al. |
| 5,815,912 | A | 10/1998 | Willshere et al. |
| 5,974,654 | A | 11/1999 | Morita |
| 6,695,298 | B1 | 2/2004 | Hertz et al. |
| 6,726,195 | B1 | 4/2004 | Hertz et al. |
| 7,017,489 | B2 | 3/2006 | Perault et al. |
| 7,028,391 | B2 | 4/2006 | Pham-Van Diep et al. |
| 7,040,228 | B2 | 5/2006 | Perault et al. |
| 7,121,199 | B2 | 10/2006 | Perault et al. |
| 7,293,691 | B2 | 11/2007 | Rossmeisl et al. |
| 2002/0020346 | A1 | 2/2002 | Doyle et al. |
| 2002/0138977 | A1 | 10/2002 | Nagao et al. |

FOREIGN PATENT DOCUMENTS

| | | |
|---|---|---|
| DE | 36 30 441 A1 | 7/1987 |
| WO | 03006243 A1 | 1/2003 |

OTHER PUBLICATIONS

Patent Abstracts of Japan JP 07 314361 A (Fanuc Ltd.); Dec. 5, 1995; 1 pg.
International Search Report for PCT/US2008/056937 mailed Jun. 26, 2008.

*Primary Examiner*—Leslie J Evanisko
(74) *Attorney, Agent, or Firm*—Lando & Anastasi, LLP

(57) ABSTRACT

A control apparatus for multiplexing a single distributed control amplifier to control multiple axes of motion in a multi-axis machine. In one example, the control apparatus comprises a distributed control motor amplifier, a first motor constructed and arranged to provide movement along a first axis of motion, a second motor constructed and arranged to provide movement along a second axis of motion, a first relay having a switch coupled to the distributed control motor amplifier, a first contact coupled to the first motor, a second contact coupled to the second motor, and an input for receiving an actuation signal, wherein the relay is configured to be manipulated between a first state in which the switch is electrically connected to the first contact a second state in which the switch is electrically connected to the second contact, in response to the actuation signal.

7 Claims, 5 Drawing Sheets

STENCIL PRINTER WITH MULTIPLEXED CONTROL OF MULTI-AXIS MACHINE HAVING DISTRIBUTED CONTROL MOTOR AMPLIFIER

BACKGROUND

1. Field of the Invention

The present invention is directed to a method and apparatus for controlling axes of motion in automated or semi-automated machinery.

2. Discussion of Related Art

In a typical surface-mount circuit board manufacturing operation, a stencil printer is used to print solder paste onto a printed circuit board. A circuit board, broadly referred to as an electronic substrate, having a pattern of pads or some other conductive surface onto which solder paste will be deposited, is automatically fed into the stencil printer. One or more small holes or marks on the circuit board, called fiducials, is used to properly align the circuit board with the stencil or screen of the stencil printer prior to the printing of solder paste onto the circuit board. Once a circuit board has been properly aligned with the stencil in the printer, the circuit board is raised to the stencil by a substrate support, e.g., a table having pins, or a flexible support and fixed with respect to the stencil. Solder paste is then dispensed onto the stencil, and a wiper blade or squeegee traverses the stencil to force the solder paste through apertures formed in the stencil and onto the board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste is typically dispensed onto the stencil from a standard cartridge. After the print operation, the board is then released, lowered away from the stencil, and transported to another station within the printed circuit board fabrication line.

The stencil printers described above may typically be used in an electronics manufacturing facility in an automated assembly line with other equipment used to manufacture the circuit boards. The other equipment in-line with the stencil printers may include, for example, pick and place machines which place components on circuit boards, dispensing systems which are used for dispensing metered amounts of liquid or paste for a variety of applications, reflow ovens that are used to cure materials dispensed onto the circuit boards, and conveyors that may move circuit boards or other parts from one manufacturing station to another. These and many other types of automated or semi-automated machinery, use motors to provide movement of a variety of parts along different axes of motion. For example, in the stencil printers, motors may be used to move the squeegees and to move the circuit boards. In these and similar systems, a plurality of motors is generally required, one motor for each axis of motion (e.g., the x-axis, y-axis and z-axis), to provide desired motion along multiple axes. In conventional systems, a dedicated driver amplifier is required for each motor, and in addition, tuning parameters of the motors can be set for only one axis at a time.

SUMMARY OF INVENTION

As discussed above, typical motion control amplifiers have been used to control only one motor which in turn can only provide movement along one axis of motion. According to embodiments of the invention, there is provided a cost effective implementation that allows multiple axes of motion to be controlled with a single distributed control motor amplifier within a multi-axis machine. This implementation may provide significant space savings and cost savings for machinery by reducing the number of control motor amplifiers required to operate the machine.

One embodiment is directed to a stencil printer for printing viscous material on a substrate, the stencil printer comprising a frame, a stencil coupled to the frame, a print head, coupled for the frame, to deposit and print viscous material over the stencil, a substrate supporting mechanism constructed and arranged to hold the substrate, and a control apparatus for controlling movement along multiple axes of motion in the stencil printer. The control apparatus may comprise a distributed control motor amplifier, a first motor constructed and arranged to provide movement along a first axis of motion, a second motor constructed and arranged to provide movement along a second axis of motion, and a first relay having a switch coupled to the distributed control motor amplifier, a first contact coupled to the first motor, a second contact coupled to the second motor, and a coil for receiving an actuation signal, wherein the relay is configured to be manipulated in response to the actuation signal between a first state in which the switch is electrically connected to the first contact a second state in which the switch is electrically connected to the second contact.

In one example, the first and second motors are coupled to the substrate supporting mechanism to provide movement of the substrate supporting mechanism. This movement may be in the x-, y-, or z-direction, and in one example, may be in the z-axis direction to move the substrate closer to and further away from the print head. In another example, the control apparatus may further comprise a direct current source that provides a direct current signal, wherein the first relay comprises an additional contact coupled to the direct current source, and wherein the first relay is constructed and arranged such that when the relay is in the first state, the direct current signal is applied to the second motor. The first and second motors may each comprise, for example, a stepper motor. In another example, the control apparatus may further comprise a power supply and a second relay having a switch coupled to the power supply, a first contact coupled to the first motor, a second contact coupled to the second motor, and a coil for receiving the actuation signal. The distributed control motor amplifier may comprise a motor output coupled to the switch of the first relay, the motor output being constructed and arranged to provide power for a selected one of the first and second motors, and a control output coupled to the coil of the first relay and constructed and arranged to provide the actuation signal. In another example, the apparatus may further comprise a controller that supplies a control signal to the distributed control motor amplifier, and the control signal may include operating parameters for the selected one of the first and second motors.

According to another embodiment, a method of controlling multiple axes of motion in a stencil printer may comprise switching a common control and power supply between a first mechanism controlling a first axis of motion and a second mechanism controlling a second axis of motion so as to provide power to a selected axis of motion, and activating a relay to accomplish the switching.

Another embodiment is directed to a method of controlling multiple axes of motion in a stencil printer, the method comprising selecting movement along a first axis of motion, providing power from a distributed control motor amplifier to a first motor constructed and arranged to provide movement along the first axis of motion, deselecting movement along the first axis of motion, after deselecting movement along the first axis of motion, selecting movement along a second axis of motion, and providing power from the distributed control motor amplifier to a second motor constructed and arranged to provide movement along the second axis of motion.

In one example, the acts of selecting and deselecting movement along the axes of motion may include activating a relay coupled to the distributed control motor amplifier and the first and second motors so as to switch coupling of the distributed control motor amplifier from the first motor to the second motor. In one example, the first axis of motion may be in the z-direction and the first motor may be coupled to a substrate supporting mechanism, wherein when power is coupled to the first motor, the substrate supporting mechanism is moved in the z-direction. In another example, the method may further comprise an act of providing a direct current signal to the first motor when movement along the first axis of motion is deselected.

According to another embodiment, a control apparatus for controlling movement along multiple axes of motion in a multi-axis machine may comprise a distributed control motor amplifier, a first motor constructed and arranged to provide movement along a first axis of motion, a second motor constructed and arranged to provide movement along a second axis of motion, and a first relay having a switch coupled to the distributed control motor amplifier, a first contact coupled to the first motor, a second contact coupled to the second motor, and an input for receiving an actuation signal, wherein the relay is configured to be manipulated in response to the actuation signal between a first state in which the switch is electrically connected to the first contact, and a second state in which the switch is electrically connected to the second contact.

In one example, the multi-axis machine may be a stencil printer or a dispenser. In another example, the control apparatus may further comprise a direct current source that provides a direct current signal, wherein the first relay comprises an additional contact coupled to the direct current source, and wherein the first relay is constructed and arranged such that when the relay is in the first state, the direct current signal is applied to the second motor. The first and second motors may each comprise a stepper motor. In another example, the control apparatus may further comprise a second relay having a switch coupled to a power supply, a first contact coupled to the first motor, a second contact coupled to the second motor, and an input for receiving the actuation signal. The distributed control motor amplifier may comprise a motor output coupled to the switch of the first relay, the motor output being constructed and arranged to provide power for a selected one of the first and second motors, and a control output coupled to the input (or coil) of the first relay and constructed and arranged to provide the actuation signal.

According to another embodiment, a method of controlling multiple axes of motion in a multi-axis machine may comprise acts of selecting movement along a first axis of motion, providing power to a first motor constructed and arranged to provide movement along the first axis of motion, deselecting movement along the first axis of motion, after deselecting movement along the first axis of motion, selecting movement along a second axis of motion, and providing power to a second motor constructed and arranged to provide movement along the second axis of motion.

In one example, the acts of selecting and deselecting movement along the axes of motion may include activating a relay coupled to a distributed control motor amplifier and the first and second motors so as to switch coupling of the distributed control motor amplifier from the first motor to the second motor. In another example, the method may further comprise an act of providing a direct current signal to the first motor when movement along the first axis of motion is deselected.

BRIEF DESCRIPTION OF THE DRAWINGS

Aspects and embodiments of the invention are described in detail below with reference to the accompanying drawings. It is to be appreciated that the drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
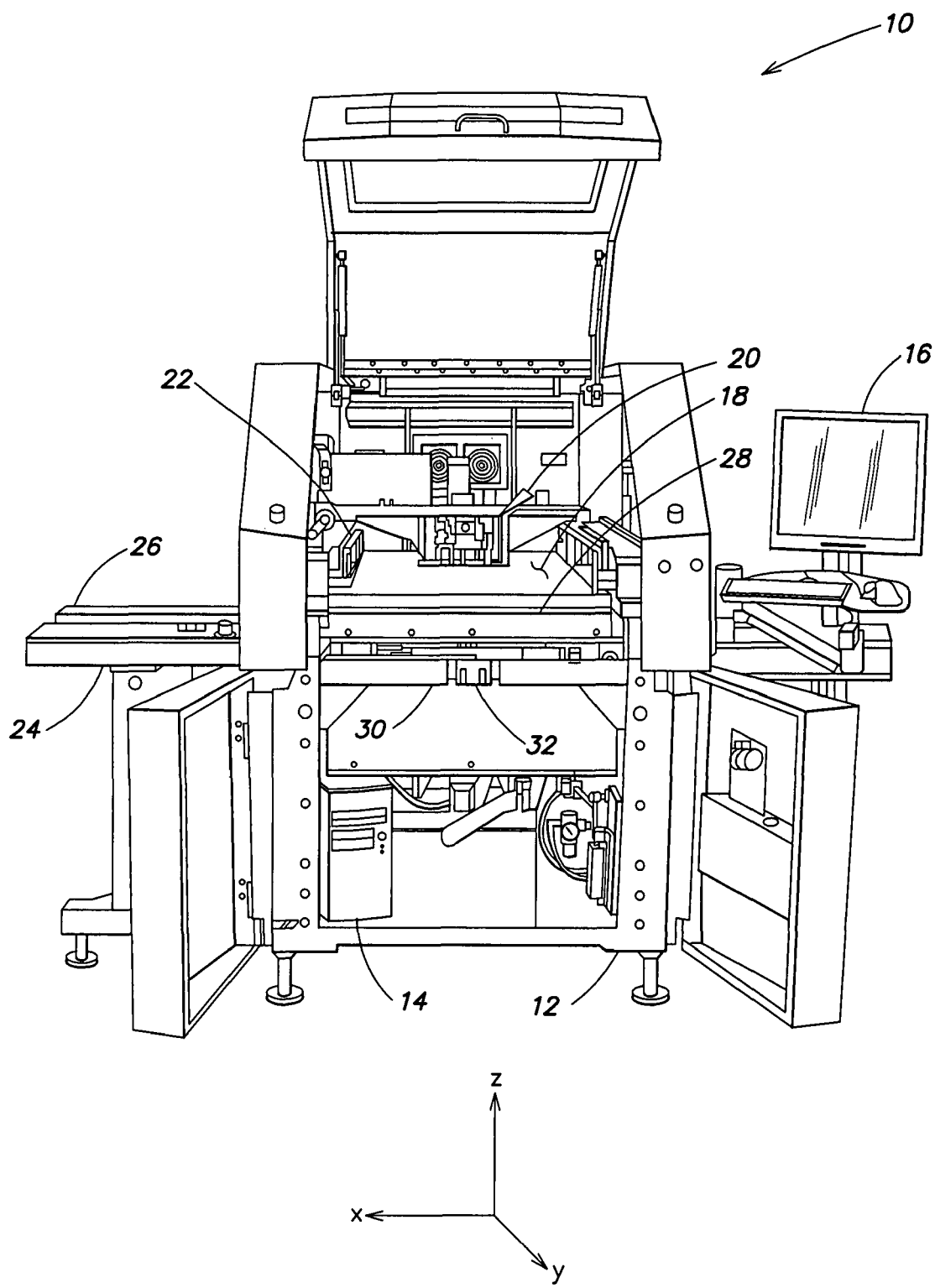
FIG. 1 is a diagram of a stencil printer in which a control apparatus according to embodiments of the invention may be used.

Aspects and embodiments of the invention are directed to a control apparatus which may multiplex a single distributed control amplifier to control multiple axes of motion for many types of automated or semi-automated machinery. On industrial machinery with a multiplicity of axes of motion, it is common that motion on some axes excludes motion on some other axes. In this case, it is possible to designate a group of axes that have similar power requirements, do not require simultaneous motion, and may therefore share a common axis controller. The result may be reduced cost, due to a reduced number of components, and reduced space consumed by control circuitry, both of which may be advantageous.

It is to be appreciated that this invention is not limited in its application to the details of construction and the arrangement of components set forth in the following description or illustrated in the drawings. The invention is capable of other embodiments and of being practiced or of being carried out in various ways. For example, although embodiments of the present invention are described with reference to a stencil printer used to print solder paste onto a printed circuit board, it is to be appreciated that the control apparatus may be used with any type of automated or semi-automated machinery, not limited to use in stencil printers. Examples of specific implementations are provided herein for illustrative purposes only and are not intended to be limiting. In particular, acts, elements and features discussed in connection with one embodiment are not intended to be excluded from a similar role in other embodiments. Also, the phraseology and terminology used herein is for the purpose of description and should not be regarded as limiting. The use of "including," "comprising," "having," "containing," "involving," and variations thereof herein, is meant, to encompass the items listed thereafter and equivalents thereof as well as additional items.

Referring now to the drawings, and more particularly to FIG. 1, there is generally indicated at 10 a stencil printer of an embodiment of the invention. As shown, the stencil printer 10 includes a frame 12 that supports components of the stencil printer and includes a door frame 30 with a magnetic door latch 32. The components, in part, may include a controller 14, a user interface 16, a stencil 18, stencil shelf 22, and a print head 20 having a dispenser from which solder paste may be dispensed. Each of these components may be suitably coupled to the frame 12. In one embodiment, the print head 20 is on a gantry which enables the print head to be moved in the x-, y- and z-directions under the control of the controller 14. As described below in further detail, the print head 20 may be placed over the stencil 18 and moved across the stencil to allow printing of solder paste or any other type of viscous material, such as adhesives, epoxies, encapsulates and underfills, onto a circuit board or other type of electronic substrate.

Stencil printer 10 may also include a conveyor system 28 having rails 24, 26 for transporting a circuit board to a print position in the stencil printer. The stencil printer 10 has an assembly for supporting the printed circuit board (or "substrate"), which raises and secures the printed circuit board so that it is stable during a print operation. The substrate support assembly may further include a substrate support system, e.g., a plurality of pins or flexible tooling, positioned beneath the circuit board when the circuit board is in the print position. The substrate support system may be used, in part, to support the interior regions of the circuit board to prevent flexing or warping of the circuit board during the print operation. The print head 20 may be configured to receive at least one solder paste cartridge that provides solder paste to the print head during the print operation. Although not illustrated in FIG. 1, the solder paste cartridge may be coupled to one end of a pneumatic air hose, while the other end of the pneumatic air hose may be attached to a compressor that, under the control of the controller 14, provides pressurized air to the cartridge to force solder paste out of the cartridge into the print head 20 and onto the stencil 18. Mechanical devices, such as a piston, may be used in addition to, or in place of, air pressure to force the solder paste from the cartridge into the print head 20. The controller 14 may be configured to use a personal computer having a Microsoft DOS or WINDOWS XP™ (a trademark of the Microsoft Corporation) operating system with application specific software to control the operation of the stencil printer 10.

In one configuration, the stencil printer 10 operates as follows. A circuit board is loaded into the stencil printer 10 using the conveyor rails 24, 26. The support assembly raises and secures the circuit board to a print position. The print head 20 is then lowered in the z-direction until blades of the print head contact the stencil 18. The print head 20 is then moved in the y-direction across the stencil 18. The print head 20 deposits solder paste out of the dispenser of the print head through apertures in the stencil 18 and onto the circuit board. Once the print head 20 has fully traversed the stencil 18, the circuit board is released, lowered back onto the conveyor rails 24, 26 and transported from the printer 10 so that a second circuit board may be loaded into the printer. To print on the second circuit board, the print head 20 is moved across the stencil 18 in the direction opposite to that used for the first circuit board. Alternatively, in another embodiment, a squeegee arm (not shown) could swing inwardly to contain the solder paste in the print head 20, and the print head can then be lifted in the z-direction and moved back to its original position to perform a print operation on the second circuit board using a similar direction stroke.

As discussed above, a stencil printer such as that described above, may include a plurality of motors that are used to provide movement of various parts, e.g., the conveyor, the print head, the squeegee arm, etc., along the x-, y-, and/or z-axis motion. Motion on at least some of these axes may exclude motion on some other axes. In this case, it may be possible to designate a group of axes that have similar power requirements, do not require simultaneous motion, and may therefore share a common axis controller. Thus, a control apparatus according to embodiments of the invention, and discussed in detail below, may be used to control any or all of the plurality of system motors, thereby reducing the number of dedicated motor controllers and reducing the overall cost and complexity of the system.

Figure 2:
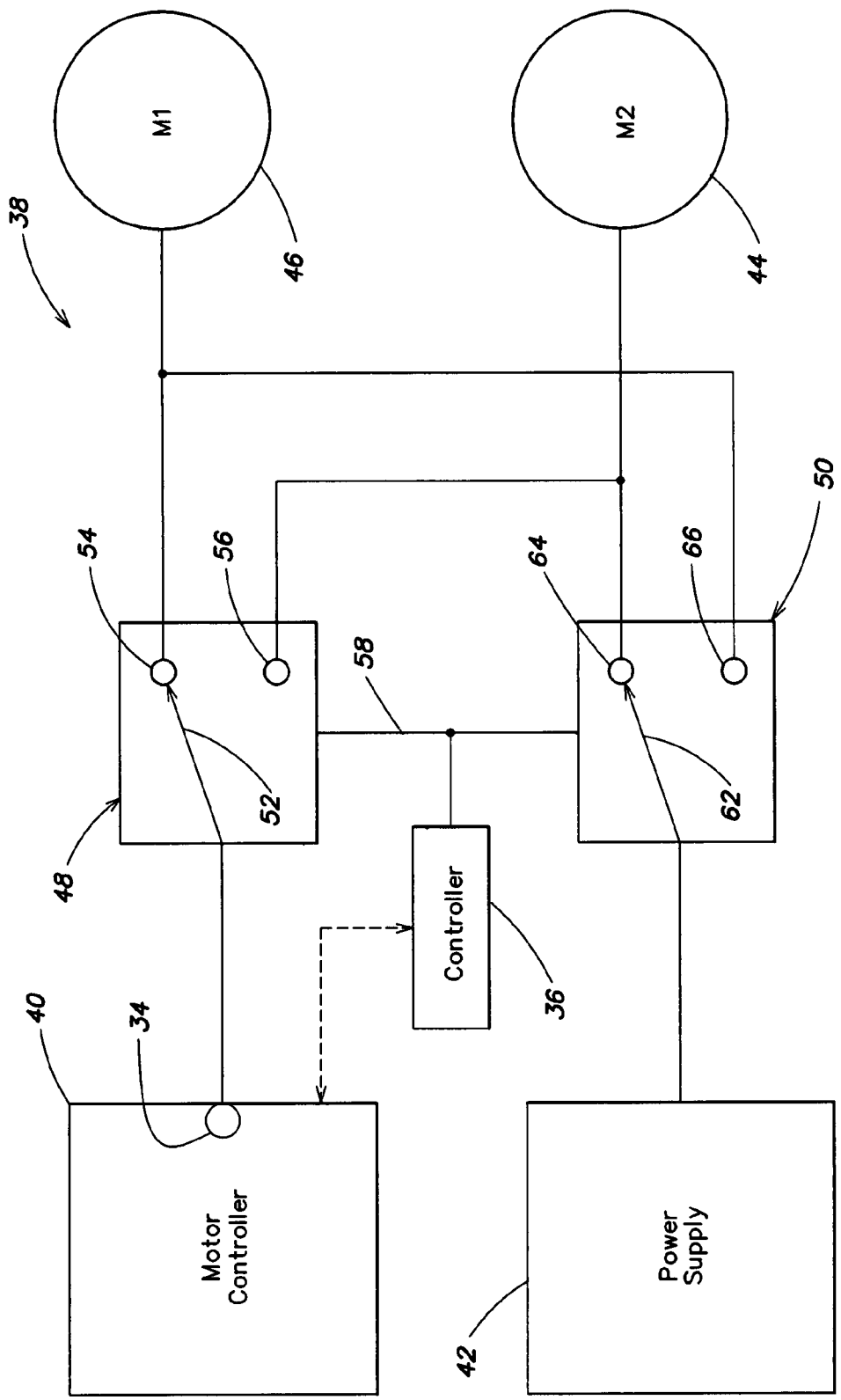
FIG. 2 is a block diagram of one embodiment of an apparatus according to aspects of the invention.

Referring to FIG. 2, there is illustrated a block diagram of a system according to an embodiment of the invention. The system 38 comprises controller 36, a distributed control motor amplifier 40, and two motors 44, 46. One example of a suitable distributed control motor amplifier is available from Copley Controls of Canton, Mass. under part number STM-075-07 although it is to be appreciated that many other amplifiers may also be used. The distributed control motor amplifier includes a motor power output 34 that, under direction of the controller 36, may supply power to one or more of the motors 44, 46, as discussed further below. In one example where the system 38 is used in a stencil printer, such as stencil printer 10 (see FIG. 1), the controller 36 may be the controller 14 of the stencil printer. Alternatively, in some examples, the controller 36 may be part of the distributed control motor amplifier 40, or may be a separate computer or other control apparatus. Each of the motors 44, 46 may be used to provide movement of equipment along a particular axis of motion. This equipment may include a wide of variety of movable machine parts, such as for example, a squeegee of a stencil printer, a conveyor, or an automated arm of a pick-and-place machine. For simplicity and conciseness, in the following description the control motor amplifier may be described as controlling different axes of motion without reference to the actual equipment that is being moved along a given axis of motion. It is to be appreciated that the invention is not limited to use with any particular equipment and as discussed above, may be applicable to any automated or semi-automated machinery.

To implement a shared control driver amplifier among several axes, the motor power output of the distributed control motor amplifier 40 may be directed to a selected axis (of the several axes) via a switch, such as a relay. Referring again to FIG. 2, in one embodiment, relays 48 and 50 may be used to multiplex power and control from the distributed control motor amplifier 40 among the two, or more, motors 44, 46. The relays 48, 50 may be any type of relays that are able to handle the current required to power the motors. The first relay 48 comprises a switch 52 coupled to the distributed motor control amplifier 40, the switch being capable of being manipulated between a first contact 54 and a second contact 56 which are coupled to the first motor 44 and the second motor 46, respectively. The relay 48 is configured such that, in response to an actuation signal on line 58 from the controller 36, the switch 52 may electrically connect either the first contact 54 or second contact 56 to the motor control amplifier 40. In this manner, the relay 48 may be used to alternatively couple signals from the distributed motor control amplifier 40 to either motor 44 or motor 46. It is to be appreciated that in other examples, the actuation signal may alternatively be provided from the distributed control motor amplifier 40, rather than from the controller 36.

In many circumstances, it may be important that the axis or axes of motion that are "deselected" (i.e., switched out of electrical connection with the distributed control motor amplifier) precisely maintain their position. Different mechanisms may be required to maintain position depending on the type of motor used on the various axes of motion. For example, if the motor is a servo motor, an electro-mechanical brake may be required on that motor. Alternatively, if the motor is a stepper motor, the natural electro-magnetic detent may be used to hold position. The stepper motor should be stopped on a detent that can be reconstructed after the motor is reselected and the motor drive output is re-enabled. For example, if a stepper drive always re-enables at phase A plus, then the drive should be stopped at phase A plus before power and controls are transferred to another axis.

In some instances, the natural detent at which the motor should be stopped may not be sufficient to hold the position of the motor, particularly in the presence of mechanical forces such as shaking due to environmental factors (e.g., movement of other equipment may cause shaking of the stopped axis). Therefore, according to one embodiment, a direct current (DC) signal may be applied to the motor drive to hold the motor in position. This DC signal may be inserted in the phase (e.g., phase A plus) in which the motor is stopped. Referring again to FIG. 2, the system 38 may comprise a DC power supply 42, for example, a 24 Volt supply, which may be used to, power control electronics. In one embodiment, this DC power supply may be used to supply the small DC signal to hold the motor position. As shown in FIG. 2, the second relay 50 comprises a switch 62 coupled to the power supply 42 and first and second contacts 64, 66 coupled to the first and second motors 44, 46. The second relay 50 may operate in the same manner as described for relay 48 to alternatively couple DC holding power from the power supply 42 to either motor 44 or motor 46, responsive to a signal from the controller 36 (or from the distributed control motor amplifier 40). The relays 48, 50 may be controlled such that when the switch 52 of the first relay 48 is connected to the first contact 54, thus "selecting" the first motor 44 by coupling the distributed motor control amplifier to the first motor, the switch of the second relay 50 may be connected to the first contact 64 to couple the power supply 42 to the second motor 46. Thus, while the "selected" motor 44 is coupled to the distributed control motor amplifier 40, the "deselected" motor 46 is provided with a DC "holding current" to maintain the deselected motor is position until it is switched into communication with the distributed control motor amplifier. The amplitude of the DC signal may be empirically determined as it may be dependent on the torque of the motor and other considerations, as will be recognized by those skilled in the art.

It is to be appreciated that through the use of additional relays or relays with additional contacts, control signals and power can be multiplexed from a signal distributed motor control amplifier and power supply to multiple motors. This apparatus may replace multiple driver controllers (i.e., controls and power) for multiple axes of motion with one distributed control motor amplifier and power supply, and a plurality of relays. This apparatus may be used anywhere that a simplified design of multiple axis motion is needed and/or cost savings is desired. Furthermore, it is to be appreciated that the invention is not limited to the exact configuration illustrated in FIG. 2 and many variations are possible. For example, the relays 48, 50 need not be separate relays, and instead, one relay with additional contacts may be used to multiplex both control and the DC holding power among the two (or more) motors. Furthermore, as discussed above, the controller 36 may be part of the distributed control motor amplifier and/or the signal to switch the relays may be provided by the distributed control motor amplifier rather than by the controller 36.

According to one embodiment, the distributed control motor amplifier 40 may comprise control circuitry that may control operating parameters of the motor(s), such as operating voltage, current, speed and direction, as well as many other parameters, for each motor. These parameters may be different from one motor to another and in conventional systems, can only be set for one axis of motion at a time. In one example, the distributed control motor amplifier may receive these operating parameters for a selected motor from the controller 36. The distributed control motor amplifier may receive instructions to actuate the relay(s) to select a particular motor and, at the same (or nearly the same) time, may be programmed with appropriate operating parameters for that motor. Thus, according to embodiments of the invention, every time a motor is switched (multiplexed) into connection with the distributed control motor amplifier, the distributed control motor amplifier can be programmed to provide the correct operating parameters for that motor. Accordingly, operating parameters can be changed "on the fly" as the motor amplifier is multiplexed among a plurality of motors.

Figure 3:
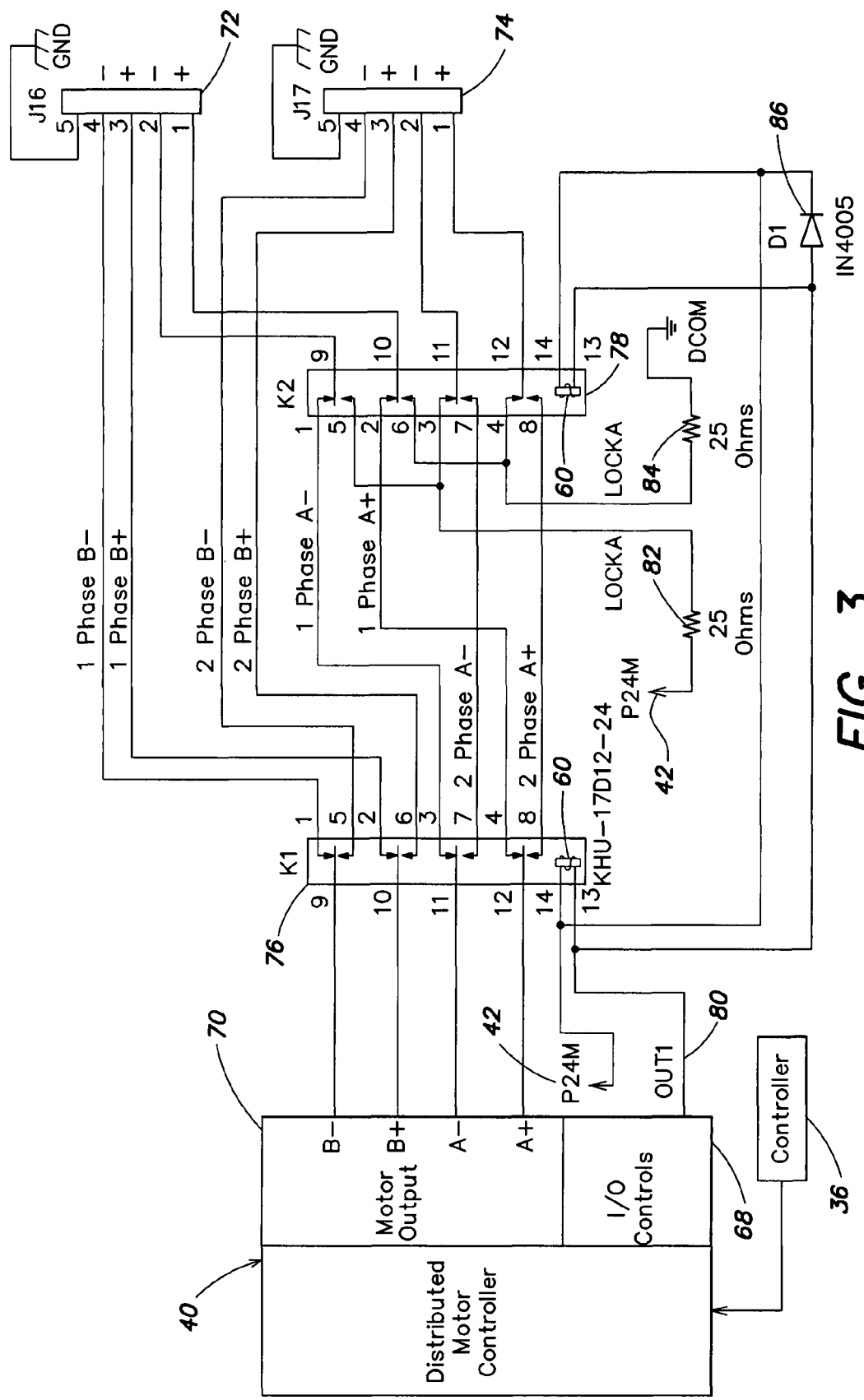
FIG. 3 is a schematic diagram of an apparatus according to an embodiment of the invention.

Referring to FIG. 3, there is illustrated a schematic diagram of one embodiment of an apparatus according to aspects of the invention. The apparatus may comprise a plurality of motor connectors, for example, motor connector 72 and motor connector 74, although it is to be appreciated that the apparatus is not limited to two motor connectors. Motors 44, 46 (not shown in FIG. 3) are coupled to the motor connectors 72, 74. In this embodiment, the distributed control motor amplifier 40 includes I/O (input/output) control circuitry 68 and a power interface 70. Power is supplied via the power interface 70 to the motor connectors 72, 74 to control and power the motors 44, 46. The power supplied via the power interface is typically an alternating current (AC), multi-phase power supply as known to those skilled in the art. In the illustrated example, the power interface 70 includes four power outputs corresponding to four electrical phases of power, A plus, A minus, B plus and B minus. However, it is to be appreciated that the apparatus is not limited to the use of these electrical phases.

Still referring to FIG. 3, a first relay 76 may couple power to the first motor connector 72 and to the second motor connector 74. A second relay 78 may couple both motor power and the DC holding current to the motor connectors. In one example, these relays may be supplied from Potter and Brumfield under part number KHAU-17012-24. However, it is to be appreciated that other relays may also be used. The DC signal may be provided, as discussed above, by a DC power supply 42. Phase lock resistors 82, 84 may be used to insert the DC signal into an appropriate electrical phase of the motor power. In the illustrated example, the power coupled directly to the motor connectors includes phases B plus and B minus and the DC signal is coupled to phases A plus and A minus; however, it is to be appreciated that the invention is not so limited. A suppression diode 86 may be used to protect the circuit against voltage surges. A control signal may be supplied on line 80 from the I/O control circuitry 68 to coils 60 of the relays 76, 78 to control switching of the contacts of the relays to appropriately select and deselect the motor connectors 72, 74 as discussed above in reference to FIGS. 2 and 3.

According to another embodiment, rather than, or in addition to, holding the motor in a fixed position, any movement of a deselected axis may be sensed via a feedback mechanism. This information may then be used to compensate for the movement when the axis is reselected and to return the axis to its precise position when it was deselected.

Figure 4:
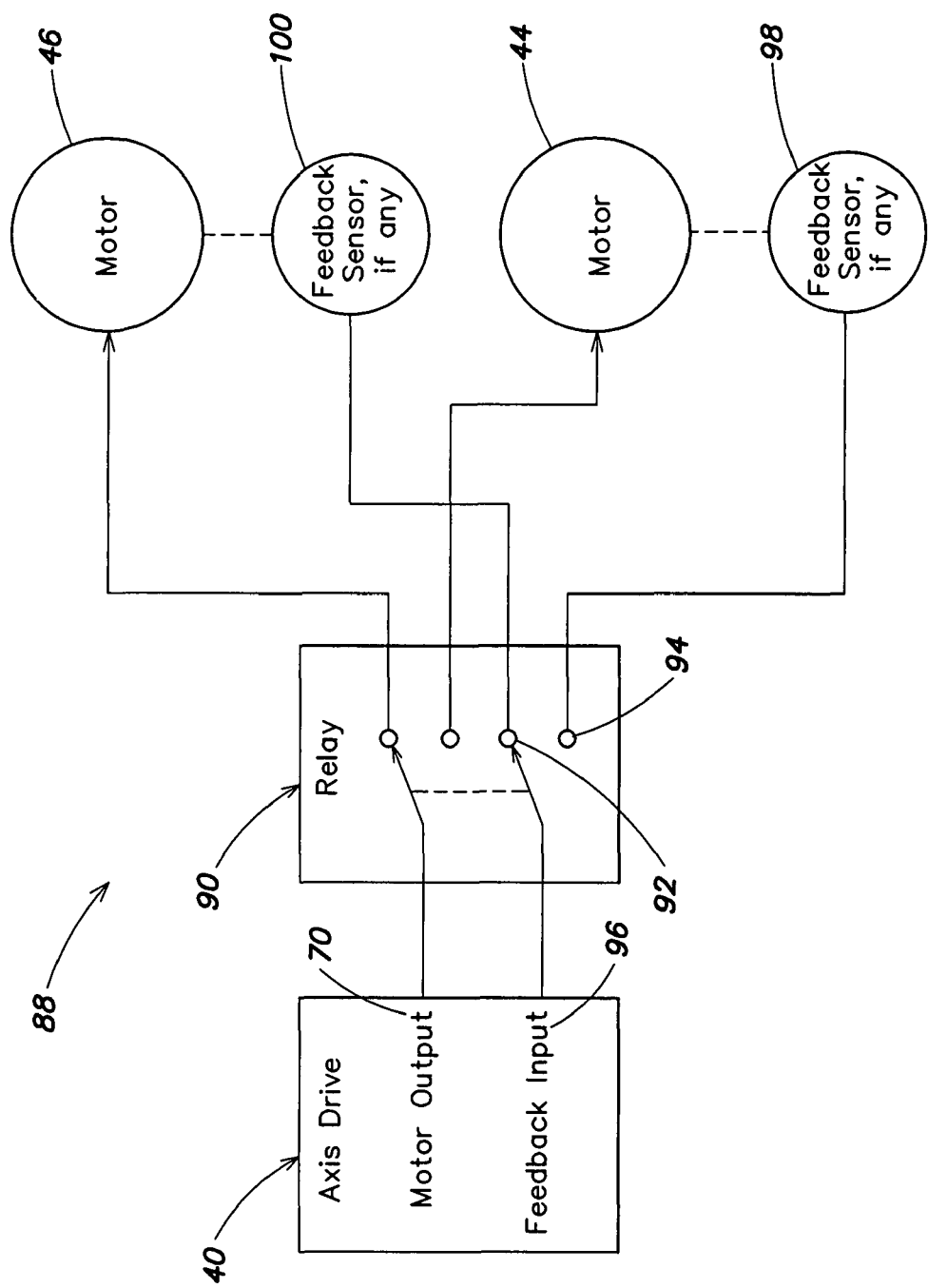
FIG. 4 is a block diagram of another embodiment of an apparatus according to aspects of the invention.

Referring to FIG. 4, there is illustrated a block diagram of one embodiment of an apparatus 88 including feedback sensing according to aspects of the invention. Relay 90 may be used to couple the motor output of the distributed control motor amplifier to the motors 44, 46, as discussed above. In addition, the relay 90 may include further contacts 92, 94 that may couple a feedback input 96 on the distributed control motor amplifier 40 to feedback sensors 98, 100 on motors 44 and 46, respectively. When, for example, motor 44 is deselected (i.e., motor 46 is switched into connection with the motor output 70 via relay 90), the feedback sensor 98 coupled to motor 44 may be multiplexed into connection with the feedback input 96. The feedback sensors 98, 100 may detect any movement on the axis to which they are coupled and provide an indication of such movement to the distributed control motor amplifier 40. The amplifier may thus receive and record information about any movement on a deselected axis and compensate for such movement when the axis is reselected. This apparatus may be used with any type of motor including, for example, a stepper motor, servo motor or variable frequency motor. It is also to be appreciated that although in the illustrated example the same relay is used to multiplex both the power signals and the feedback signals, the invention is not so limited and the use of separate relays is also contemplated.

Figure 5:
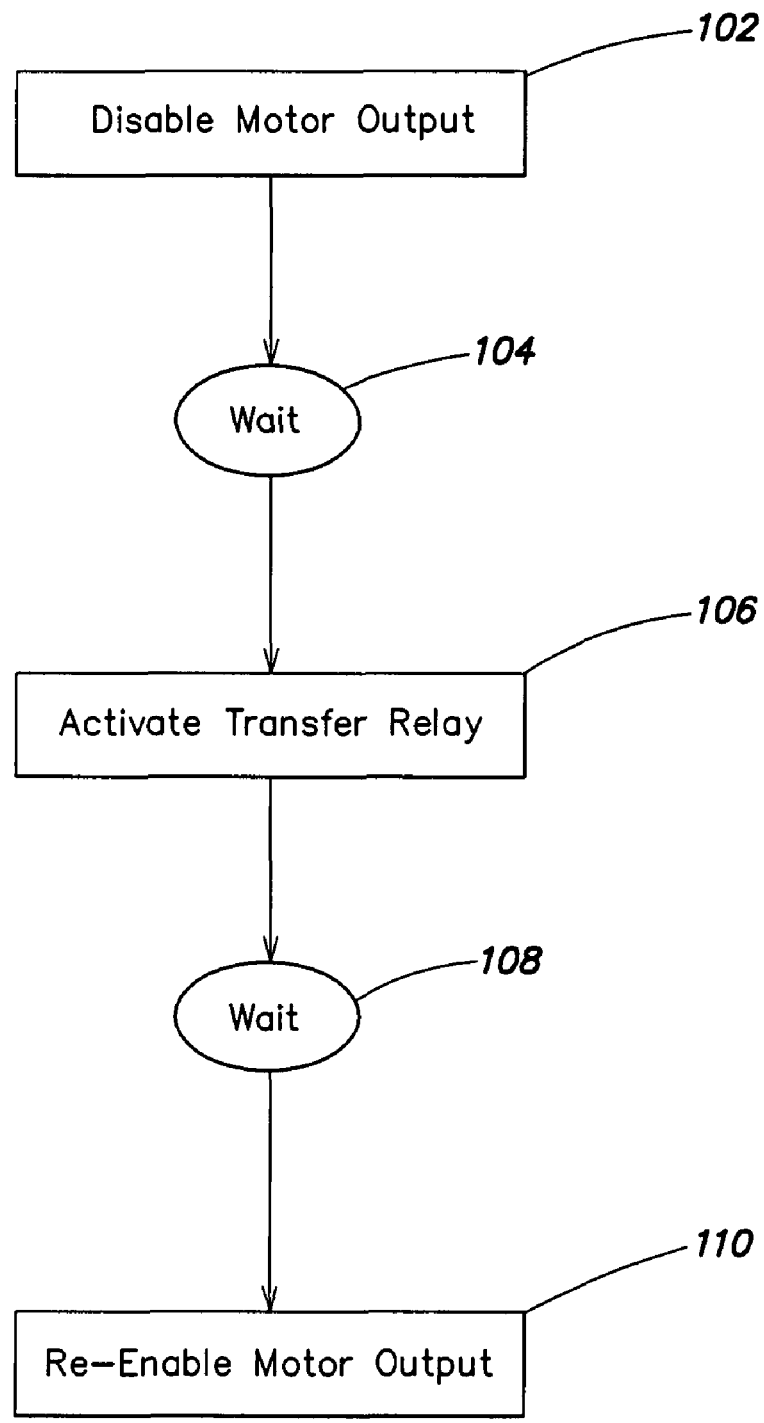
FIG. 5 is a flow diagram of one example of a method of multiplexing according to aspects of the invention.

In many applications it may be necessary or desirable to disable the motor output of the distributed control motor driver prior to switching the relay(s) so as to avoid excessive arcing in the relay contacts. Referring to FIG. 5 there is illustrated a flow diagram of one example of a multiplexing sequence that may be used in accordance with aspects of the invention. In a first step 102, the motor output of the distributed control motor amplifier may be disabled to stop power from flowing to the presently selected axis. A short time period, for example, approximately 10 milliseconds, may be selected (step 104) to allow the currents to decay. Once the currents have decayed, the transfer relay may be activated (step 106) to switch the distributed control motor amplifier into connection with another axis. Another short time period, again on the order of about 10 milliseconds for example, may be selected (step 108) to allow the relay contacts to settle. After this second time period has elapsed, the motor output of the distributed control motor amplifier may be re-enabled to power the newly selected axis (step 110).

Embodiments of the invention described above provide a multiplexing system that uses a distributed control motor amplifier to control and power multiple axes of motion, each axis having unique operating parameters. Multiple motor amplifiers may be replaced with the distributed control motor amplifier and one or more relays, as discussed above. This system may provide many advantages such as reducing wiring and components within a multi-axis machine, simplifying the motor control scheme for the machine, and providing associated cost savings. Operating parameters for axis may be programmed in the distributed control motor amplifier to create operating "profiles" for each axis, which may be downloaded to the motors in "real time" while multiplexing the motors. This may provide a fast and flexible control system for a multi-axis machine.

As discussed above, the control apparatus according to embodiments of the invention may be used in connection with a stencil printer, such as stencil printer 10. However, it is to be appreciated that the invention is not limited to use with stencil printers but can also be applied to many other types of automated or semi-automated machinery. For example, embodiments of the present invention can also be used in dispensers, reflow ovens, wave solder machines, and pick and place machines, or any other apparatus used to in connection with assembly and/or manufacture of an electronic substrate (e.g., a printed circuit board or semi-conductor wafer). There are several types of dispensing systems used for dispensing metered amounts of liquid or paste for a variety of applications. These systems use motors to move various parts to dispense the liquid or paste and/or to move the objects onto which the liquid or paste is being dispensed. One application of such systems is in the assembly of printed circuit boards and integrated circuit chips. In this application, dispensing systems are used in the process of encapsulating integrated circuits with an encapsulating material and in the process of underfilling flip integrated circuit chips with an encapsulant. Some dispensing systems are also used for dispensing dots or balls of liquid epoxy or solder paste onto circuit boards and integrated circuits. The liquid epoxy and solder is used to connect components to a circuit board or to an integrated circuit. The dispensing systems described above include those manufactured and distributed by Speedline Technologies, Inc., assignee of the present invention, under the name CAMALOT™.

Such dispensing systems use several motors to provide movement of different parts along one or more axes. For example, in a typical dispensing system, a pump and dispenser assembly is mounted to a moving assembly for moving the pump and dispenser assembly along three mutually orthogonal axes (x, y, z) using servomotors controlled by a computer system or controller. To dispense a dot of liquid on a circuit board at a desired location, the pump and dispenser assembly is moved along the horizontal x and y axes until it is located over the desired location. The pump and dispenser assembly is then lowered along the vertical z axis until the nozzle of the pump and dispenser assembly is at an appropriate dispensing height over the board. The pump and dispenser assembly dispenses a dot of liquid, is then raised along the z axis, moved along the x and y axes to a new location, and is lowered along the z axis to dispense the next liquid dot. Embodiments of the control apparatus described herein may be particularly useful in such dispensing systems to multiplex control and power among the various motors that may be used to move different parts along different axes.

Having thus described several aspects and embodiments of the invention, modifications and/or improvements may be apparent to those skilled in the art and are intended to be part of this disclosure. It is to be appreciated that the invention is not limited to the specific examples described herein and that the principles of the invention may be used in a wide variety of applications. For example, as discussed above, the control apparatus may be used not only with stencil printers or dispensers, but with any type of automated or semi-automated multi-axis machinery. Further, the stencil printers with which the control apparatus may be used are not limited to those that print solder paste on circuit boards, but rather, include those used for printing other materials on a variety of substrates. The above description is therefore by way of example only, and includes any modifications and improvements that may be apparent to one of skill in the art. The scope of the invention should be determined from proper construction of the appended claims and their equivalents.

What is claimed is:

1. A stencil printer for printing viscous material on a substrate, the stencil printer comprising:
 a frame;
 a stencil coupled to the frame;
 a print head, coupled for the frame, to deposit viscous material over the stencil;
 a substrate support constructed and arranged to hold the substrate; and
 a control apparatus for controlling movement of at least one of the stencil, the print head and the substrate support along multiple axes of motion, the control apparatus comprising
 a distributed control motor amplifier,
 a first motor constructed and arranged to provide movement along a first axis of motion, a second motor constructed and arranged to provide movement along a second axis of motion, a first relay having a switch coupled to the distributed control motor amplifier, a first contact coupled to the first motor, a second contact coupled to the second motor, and a coil for receiving an actuation signal, and a direct current source that provides a direct current signal;

wherein the first relay is configured to be manipulated in response to the actuation signal between a first state in which the switch is electrically connected to the first contact and a second state in which the switch is electrically connected to the second contact;

wherein the first and second motors are coupled to the substrate support to provide movement of the substrate support;

wherein the first relay comprises an additional contact coupled to the direct current source; and wherein the first relay is constructed and arranged such that when the relay is in the first state, the direct current signal is applied to the second motor.

2. The stencil printer and claimed in claim 1, wherein the first and second motors each comprise a stepper motor.

3. The stencil printer as claimed in claim 1, wherein the first axis of motion is in the vertical direction to move the substrate support closer to and further away from the stencil.

4. The stencil printer as claimed in claim 1, further comprising a controller coupled to the distributed control motor amplifier, wherein the controller is constructed and arranged to provide a signal to the distributed control motor amplifier; and wherein the signal includes operating parameters for the selected one of the first and second motors.

5. A stencil printer for printing viscous material on a substrate, the stencil printer comprising:
 a frame;
 a stencil coupled to the frame;
 a print head, coupled for the frame, to deposit viscous material over the stencil;
 a substrate support constructed and arranged to hold the substrate; and
 a control apparatus for controlling movement of at least one of the stencil, the print head and the substrate support along multiple axes of motion, the control apparatus comprising
  a distributed control motor amplifier,
  a first motor constructed and arranged to provide movement along a first axis of motion
  a second motor constructed and arranged to provide movement along a second axis of motion, and
  a first relay having a switch coupled to the distributed control motor amplifier, a first contact coupled to the first motor, a second contact coupled to the second motor, and a coil for receiving an actuation signal;
 wherein the first relay is configured to be manipulated in response to the actuation signal between a first state in which the switch is electrically connected to the first contact and a second state in which the switch is electrically connected to the second contact; and wherein the stencil printer further comprises a second relay having a switch coupled to the distributed control motor amplifier, a first contact coupled to the first motor, a second contact coupled to the second motor, and a coil for receiving the actuation signal.

6. The stencil printer as claimed in claim 5, wherein the distributed control motor amplifier comprises:
 a motor output coupled to the switch of each of the first relay and the second relay, the motor output being constructed and arranged to provide power for a selected one of the first and second motors; and
 a control output coupled to the coil of each of the first relay and the second relay and constructed and arranged to provide the actuation signal.

7. A stencil printer for printing viscous material on a substrate, the stencil printer comprising:
 a frame;
 a stencil coupled to the frame;
 a print head, coupled for the frame, to deposit viscous material over the stencil;
 a substrate support constructed and arranged to hold the substrate;
 a power supply;
 a second relay; and
 a control apparatus for controlling movement of at least one of the stencil, the print head and the substrate support along multiple axes of motion, the control apparatus comprising
  a distributed control motor amplifier,
  a first motor constructed and arranged to provide movement along a first axis of motion
  a second motor constructed and arranged to provide movement along a second axis of motion, and
  a first relay having a switch coupled to the distributed control motor amplifier, a first contact coupled to the first motor, a second contact coupled to the second motor, and a coil for receiving an actuation signal;
 wherein the first relay is configured to be manipulated in response to the actuation signal between a first state in which the switch is electrically connected to the first contact and a second state in which the switch is electrically connected to the second contact;
 wherein the second relay comprises a switch coupled to the power supply, a first contact coupled to the first motor, a second contact coupled to the second motor, and a coil for receiving the actuation signal;
 wherein the second relay is configured to be manipulated in response to the actuation signal between a first state in which the switch is electrically connected to the first contact and a second state in which the switch is electrically connected to the second contact; and
 wherein the first and second relays are configured such that when the first relay is in the first state, the second relay is in the second state.

* * * * *